United States Patent
Yanbo et al.

(10) Patent No.: US 7,843,235 B2
(45) Date of Patent: Nov. 30, 2010

(54) OUTPUT SLEW RATE CONTROL IN LOW VOLTAGE DIFFERENTIAL SIGNAL (LVDS) DRIVER

(75) Inventors: Wang Yanbo, Shanghai (CN); Tao Li, Shanghai (CN)

(73) Assignee: Integrated Device Technology, Inc., San Jose, CA (US)

( * ) Notice: Subject to any disclaimer, the term of this patent is extended or adjusted under 35 U.S.C. 154(b) by 0 days.

(21) Appl. No.: 11/948,993

(22) Filed: Nov. 30, 2007

(65) Prior Publication Data

US 2008/0129349 A1 Jun. 5, 2008

Related U.S. Application Data

(60) Provisional application No. 60/868,665, filed on Dec. 5, 2006.

(51) Int. Cl.
*H03B 1/00* (2006.01)
(52) U.S. Cl. .................. 327/108; 327/112; 327/179; 326/83
(58) Field of Classification Search ......... 327/108–112, 327/170; 326/26, 27, 82, 83
See application file for complete search history.

(56) References Cited

U.S. PATENT DOCUMENTS

| 6,975,141 B2 * | 12/2005 | Mueller et al. ................. 326/83 |
| 7,183,804 B2 * | 2/2007 | Icking et al. ................... 326/86 |
| 2003/0025541 A1 * | 2/2003 | Humphrey et al. .......... 327/170 |
| 2007/0222486 A1 * | 9/2007 | Koch, II et al. ............. 327/112 |

* cited by examiner

*Primary Examiner*—Long Nguyen
(74) *Attorney, Agent, or Firm*—Bever Hoffman & Harms LLP

(57) ABSTRACT

A differential signal driver includes a pre-driver configured to generate a constant charging current and a constant discharging current. A first capacitor of the pre-driver is charged with the charging current when a differential input signal has a first state, and discharged with the discharging current when the differential input signal has a second state, thereby developing a first output control voltage on the first capacitor. A second capacitor of the pre-driver is discharged with the discharging charging current when the differential input signal has the first state, and charged with the charging current when the differential input signal has the second state, thereby developing a second output control voltage on the second capacitor. An output driver circuit generates a differential output signal in response to the first and second output control voltages. The slew rate of the differential output signal is controlled by the charging and discharging currents.

18 Claims, 6 Drawing Sheets

US 7,843,235 B2

OUTPUT SLEW RATE CONTROL IN LOW VOLTAGE DIFFERENTIAL SIGNAL (LVDS) DRIVER

RELATED APPLICATION

The present application is related to, and claims priority of, U.S. Provisional Patent Application Ser. No. 60/868,665 filed by Wang Yanbo and Tao Li on Dec. 5, 2006.

RELATED ART

In a conventional differential transmission line driver, a differential output voltage is provided in response to differential input signals. The differential input signals are typically applied to a simple input buffer circuit (i.e., a pre-driver), which in turn, controls a set of output switches. The output switches steer an output current through an external resistor to generate the differential output voltage.

The rise and fall time during a voltage transition is referred to as the slew rate. In a differential transmission line driver, the slew rate of the output voltage can affect the electromagnetic interference (EMI) and the permitted length of the transmission line. It is well known that a slow rise and fall time during an output voltage transition can reduce EMI and improve system performance. At the same time, a slow slew rate can tolerate a long reflection time, thereby permitting the use of a long transmission line. Low EMI and long permitted transmission lines are particularly desirable in certain differential transmission line systems, such as a multipoint low voltage differential signaling (MLVDS) system.

However, the simple input buffer circuit used to control the output switches in a conventional differential transmission line driver, typically has a large drive capability and a fast slew rate. The fast slew rate is induced because a large current exists within the simple input buffer during the transition. Moreover, in a simple input buffer circuit, the slew rate can vary greatly with the process used to fabricate the system.

It would therefore be desirable to have a differential transmission line driver capable of operating at a relatively slow slew rate, thereby overcoming the above-described deficiencies.

SUMMARY

Accordingly, the present invention provides a differential transmission line driver having a pre-driver that controls the slew rate of the differential output signal. The pre-driver includes a current source configured to generate a constant charging current, and a current sink configured to generate a constant discharging current. A first capacitor of the pre-driver is charged with the charging current when the differential input signal has a first state, and is discharged with the discharging current when the differential input signal has a second state, thereby developing a first output control voltage on the first capacitor. A second capacitor of the pre-driver is discharged with the discharging current when the differential input signal has the first state, and is charged with the charging current when the differential input signal has the second state, thereby developing a second output control voltage on the second capacitor. An output driver circuit is configured to generate the differential output signal in response to the first and second output control voltages. The values of the charging current and the discharging current determine the slew rate of the differential output signal. Thus, if long rise and fall times are desired (slow slew rate), then small charging and discharging currents are provided.

In accordance with one embodiment, the cross point of the first and output control voltages may be adjusted by providing a charging current having a different value than the discharging current. For example, providing a charging current that is greater than the discharging current will result in an increased cross point of the first and second output control voltages (which may be desirable when implementing a multipoint LVDS driver).

In accordance with one embodiment, the current source and the current sink are implemented using cascode-connected transistors, which are biased in response to a common reference current. As a result, the charging and discharging currents have a low variation with respect to process, thereby resulting in a slew rate having a low variation with respect to process.

In accordance with another embodiment, a voltage regulator is used to supply a regulated voltage to the pre-driver, thereby fixing the cross point of the first and second input control voltages to a constant value, and enabling the differential signal driver of the present invention to be used in multipoint LVDS applications.

The present invention will be more fully understood in view of the following description and drawings.

DETAILED DESCRIPTION

Figure 1:
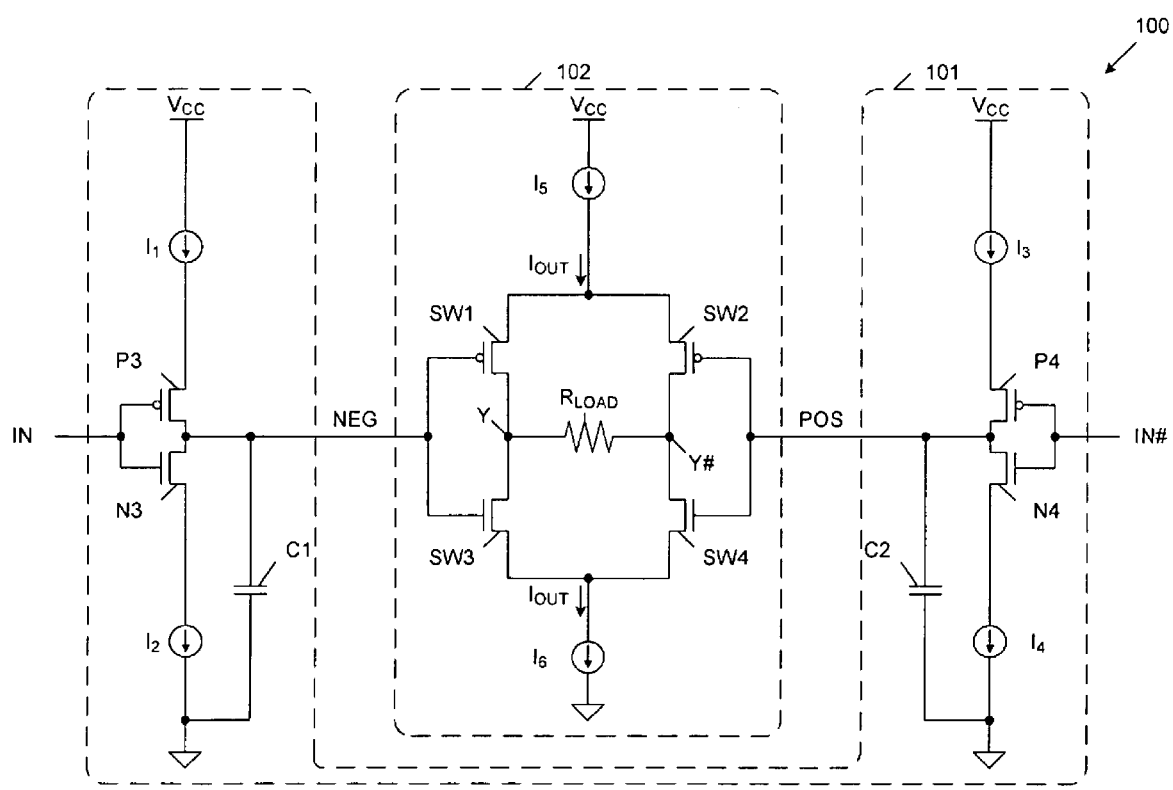
FIG. 1 is a circuit diagram of a low voltage differential signal (LVDS) driver in accordance with one embodiment of the present invention.

FIG. 1 is a circuit diagram of a low voltage differential signal (LVDS) driver 100 in accordance with one embodiment of the present invention. LVDS driver 100 includes pre-driver circuit 101 and output driver circuit 102. Pre-driver circuit 101 includes charging current sources $I_1$ and $I_3$, discharging current sources $I_2$ and $I_4$, p-channel transistors P3-P4, n-channel transistors N3-N4, and capacitors C1-C2. Output driver circuit 102 includes output current sources $I_5$-$I_6$, p-channel output switching transistors SW1-SW2, n-channel output switching transistors SW3-SW4 and load resistor $R_{LOAD}$.

In general, pre-driver circuit 101 receives a differential input signal, which includes the complementary differential input signals IN and IN#, and in response, generates output control voltages NEG and POS. Driver circuit 102 receives the output control voltages NEG and POS, and in response, drives the differential output voltages on nodes Y and Y#.

The voltage transitions of the output control voltages NEG and POS are realized by charging and discharging the load capacitors C1 and C2, respectively. The slew rates of the voltage transitions of the output control voltages NEG and POS are determined by the currents that charge and discharge capacitors C1 and C2. Thus, the slew rate of the voltage transitions of the output control voltage NEG is determined by the values of the charging current $I_1$ and the discharging current $I_2$. Similarly, the slew rate of the voltage transitions of the output control voltage POS is determined by the values of the charging current $I_3$ and the discharging current $I_4$.

The output control voltages NEG and POS control the switching transistors SW1-SW4 in output driver circuit 102 in the following manner. When the output control voltage NEG has a logic low state and the output control voltage POS has a logic high state, switching transistors SW1 and SW4 are turned on (conductive) and switching transistors SW2 and SW3 are turned off (non-conductive). Under these conditions, the output current ($I_{OUT}$) introduced by output current sources $I_5$-$I_6$ flows through the load resistance $R_{LOAD}$ from node Y to node Y#. Conversely, when the output control voltage NEG has a logic high state and the output control voltage POS has a logic low state, switching transistors SW2 and SW3 are turned on (conductive) and switching transistors SW1 and SW4 are turned off (non-conductive). Under these conditions, the output current $I_{OUT}$ introduced by current sources $I_5$-$I_6$ flows through the load resistance $R_{LOAD}$ from node Y# to node Y. The output current $I_{OUT}$ therefore flows through the load resistance $R_{LOAD}$ in different directions, in response to the varying logic states of the output control voltages NEG and POS.

If the transition of the current through the load resistance $R_{LOAD}$ is slow and smooth, the output differential voltage will have an ideal slow slew rate. The transition rate of the current in load resistance $R_{LOAD}$ is controlled by the slew rates of the voltage transitions of the output control voltages NEG and POS. As mentioned above (and described in more detail below), the slew rates of the voltage transitions of the output control voltages NEG and POS are controlled by the charging and discharging currents in the pre-driver circuit 101. Therefore, the slew rate of the output differential voltage provided across nodes Y and Y# is controlled by charging and discharging currents in the pre-driver circuit 101. That is, the charging/discharging currents $I_1$-$I_4$ can be tuned to control the slew rate of the differential output voltage.

Figure 2:
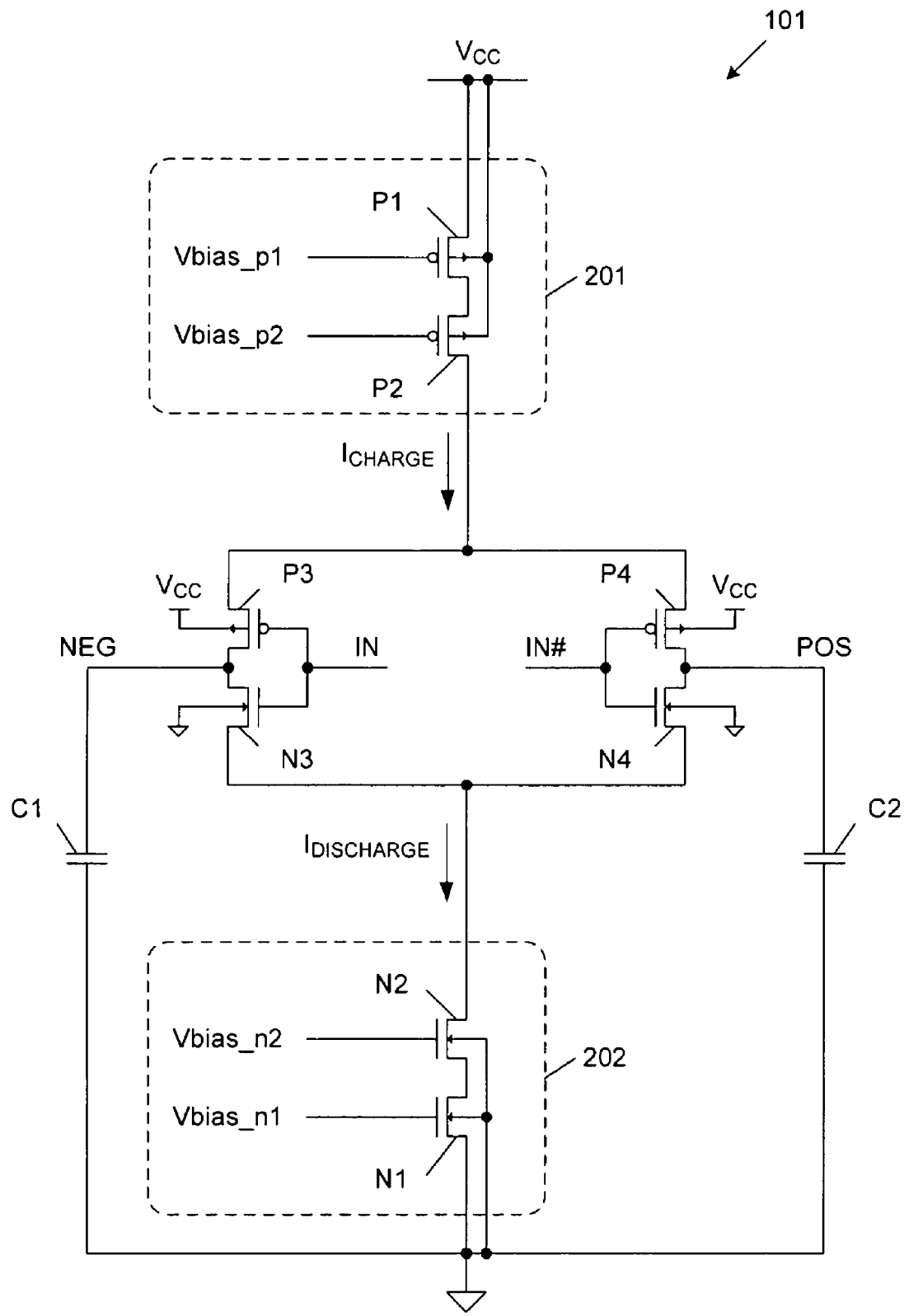
FIG. 2 is a circuit diagram of a pre-driver circuit used in the LVDS driver of FIG. 1 in accordance with one embodiment of the present invention.

FIG. 2 is a circuit diagram of pre-driver circuit 101 in accordance with one embodiment of the present invention. In this embodiment, the charging current $I_1$ is equal to the charging current $I_3$, and the discharging current $I_2$ is equal to the discharging current $I_4$. Thus, the charging currents $I_1$ and $I_3$ are represented by a single charging current $I_{CHARGE}$, which is provided by cascode current source 201. Similarly, the discharging currents $I_2$ and $I_4$ are represented by a single discharging current $I_{DISCHARGE}$, which is provided by cascode current source 202. Cascode current source 202, which sources current to the ground supply terminal, may also be referred to as cascode current sink 202.

Figure 3:
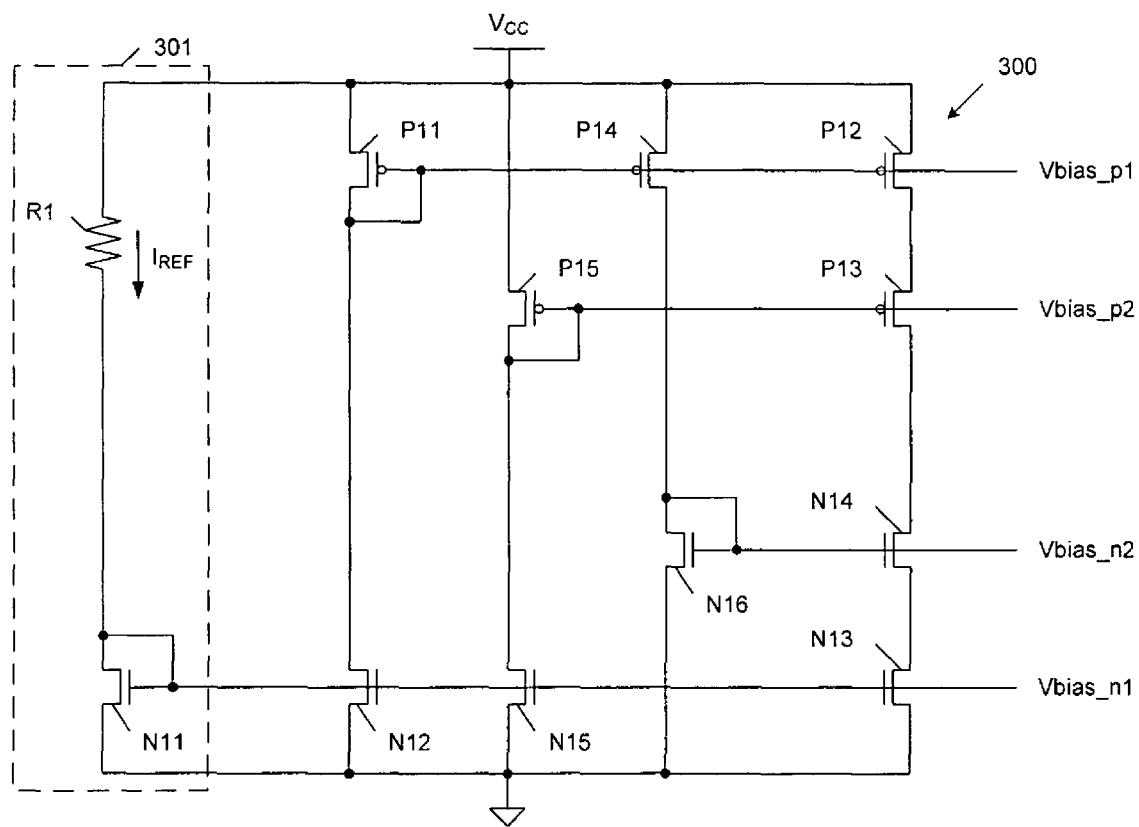
FIG. 3 is a circuit diagram of a bias circuit used to bias the pre-driver circuit of FIG. 2 in accordance with one embodiment of the present invention.

Cascode current source 201 includes p-channel transistors P1 and P2, which are connected in a cascode configuration. More specifically, p-channel transistor P1 has a source and a body region coupled to the $V_{CC}$ voltage supply terminal, a drain coupled to the source of p-channel transistor P2, and a gate coupled to receive a bias control signal Vbias_p1 from a bias control circuit (FIG. 3). P-channel transistor P2 has a body region coupled to the $V_{CC}$ voltage supply terminal, a drain coupled to the sources of p-channel transistors P3 and P4, and a gate coupled to receive a bias control signal Vbias_p2 from a bias control circuit (FIG. 3). The charging current $I_{CHARGE}$ is determined by the bias control signals Vbias_p1 and Vbias_p2.

Cascode current sink 202 includes n-channel transistors N1 and N2, which are connected in a cascode configuration. More specifically, n-channel transistor N1 has a source and a body region coupled to the ground supply terminal, a drain coupled to the source of n-channel transistor N2, and a gate coupled to receive a bias control signal Vbias_n1 from a bias control circuit (FIG. 3). N-channel transistor N2 has a body region coupled to the ground supply terminal, a drain coupled to the sources of n-channel transistors N3 and N4, and a gate coupled to receive a bias control signal Vbias_n2 from a bias control circuit (FIG. 3). The discharging current $I_{DISCHARGE}$ is determined by the bias control signals Vbias_n1 and Vbias_n2.

When the differential input signal IN has a logic low level, p-channel transistor P3 turns on, and n-channel transistor N3 turns off. Under these conditions, the charging current $I_{CHARGE}$ flows through p-channel transistor P3 to charge load capacitor C1. If the output control voltage NEG is initially at a logic low level, the charging of load capacitor C1 causes the output control voltage NEG to slowly increase to a logic high level. The rise time of the output control voltage NEG is controlled by the value of the charging current $I_{CHARGE}$.

When the differential input signal IN has a logic low level, the complementary differential input signal IN# has a logic high level. The logic high level of the differential input signal IN# turns off p-channel transistor P4, and turns on n-channel transistor N4. Under these conditions, the discharging current $I_{DISCHARGE}$ flows through n-channel transistor N4 to discharge the load capacitor C2. If the output control voltage POS is initially at a logic high level, the discharging of load capacitor C2 causes the output control voltage POS to slowly decrease to a logic low level. The fall time of the output control voltage POS is controlled by the value of the discharging current $I_{DISCHARGE}$.

Conversely, when the differential input signal IN has a logic high level, and the differential input signal IN# has a logic low level, n-channel transistor N3 turns on (and p-channel transistor P3 turns off) to enable the discharging current $I_{DISCHARGE}$ to discharge the load capacitor C1, and p-channel transistor P4 turns on (and n-channel transistor N4 turns off) to enable the charging current $I_{CHARGE}$ to charge the load capacitor C2. Under these conditions, the fall time of the output control voltage NEG is controlled by the value of the discharging current $I_{DISCHARGE}$, and the rise time of the output control voltage POS is controlled by the value of the charging current $I_{CHARGE}$.

The slew rate of LVDS driver 100 can be tuned by adjusting the charging current $I_{CHARGE}$ and the discharging current $I_{DISCHARGE}$. More specifically, the slew rate of LVDS driver 100 can be reduced (i.e., made slower) by reducing the charging and discharging currents $I_{CHARGE}$ and $I_{DISCHARGE}$. Conversely, the slew rate of LVDS driver 100 can be increased (i.e., made faster) by increasing the charging and discharging currents $I_{CHARGE}$ and $I_{DISCHARGE}$. Thus, if a slow slew rate is required to reduce the EMI and increase the length of the associated transmission line, then the bias control signals Vbias_p1, Vbias_p2, Vbias_n1 and Vbias_n2 are controlled to provide relatively small charging and discharging currents $I_{CHARGE}$ and $I_{DISCHARGE}$.

FIG. 3 is a circuit diagram of a bias control circuit 300 used to generate the bias control signals Vbias_p1, Vbias_p2, Vbias_n1 and Vbias_n2, in accordance with one embodiment of the present invention. Bias control circuit 300 includes p-channel transistors P11-P15, n-channel transistors N11-N16, and reference resistor R1.

Reference resistor R1 and n-channel transistor N11 are connected in series between the $V_{CC}$ voltage supply terminal and the ground supply terminal to form a reference current generator 301. More specifically, resistor R1 is connected between the $V_{CC}$ voltage supply terminal and the drain of n-channel transistor N11, and the source of n-channel transistor N11 is coupled to the ground supply terminal. The gate and drain of n-channel transistor N11 are commonly connected. Under these conditions, a reference current $I_{REF}$ flows through resistor R1 and n-channel transistor N11. The voltage developed on the gate of n-channel transistor N11 is provided as the bias control signal Vbias_n1.

The bias control signal Vbias_n1 is also applied to the gate of n-channel transistor N12. N-channel transistor N12 and p-channel transistor P11 are configured to mirror the reference current $I_{REF}$ flowing through the reference current generator 301. More specifically, p-channel transistor P11 and n-channel transistor N12 are connected in series between the $V_{CC}$ voltage supply terminal and the ground supply terminal, and the gate and drain of p-channel transistor P11 are commonly connected. Under these conditions, the current flowing through transistors P11 and N12 is equal to the reference current $I_{REF}$. The voltage developed on the gate of p-channel transistor P11 is provided as the bias control signal Vbias_p1.

P-channel transistor P15 and n-channel transistor N15 are configured in the same manner as p-channel transistor P11 and n-channel transistor N12, such that the current flowing through transistors P15 and N15 is also equal to the reference current $I_{REF}$. The voltage developed on the gate of p-channel transistor P15 is provided as the bias control signal Vbias_p2.

The bias control signal Vbias_p1 is also applied to the gate of p-channel transistors P14. P-channel transistor P14 and N-channel transistor N16 are configured to mirror the reference current $I_{REF}$ flowing through p-channel transistor P11. More specifically, p-channel transistor P14 and n-channel transistor N16 are connected in series between the $V_{CC}$ voltage supply terminal and ground supply terminal, and the gate and drain of n-channel transistor N16 are commonly connected. Under these conditions, the current flowing through transistors P14 and N16 is equal to the reference current $I_{REF}$. The voltage developed on the gate of n-channel transistor N16 is provided as the bias control signal Vbias_n2.

The bias control signals Vbias_p1, Vbias_p2, Vbias_n2 and Vbias_n1 are also provided to the gates of p-channel transistor P12, p-channel transistor P13, n-channel transistor N14 and n-channel transistor N13, respectively. These transistors P12, P13, N14 and N13 are connected in series between the $V_{CC}$ voltage supply terminal and the ground supply terminal.

The reference current $I_{REF}$ can be modified by changing the resistance value of the reference resistor R1. By changing the reference current $I_{REF}$, the bias voltages will be changed, which in turn, will adjust the charging and discharging currents $I_{CHARGE}$ and $I_{DISCHARGE}$. The relative values of the bias control voltage can also be modified by modifying the relative sizes of the various transistors N11-N16 and P11-P15.

In accordance with one embodiment of the present invention, the cross point between the output control voltages NEG and POS during transitions is controlled by adjusting the relative values of the charging and discharging currents $I_{CHARGE}$ and $I_{DISCHARGE}$. In most systems, the cross point between the output control voltages NEG and POS during signal transitions should be equal to $V_{CC}/2$. In LVDS driver 100, the cross point between the output control voltages NEG and POS during signal transitions will be equal to $V_{CC}/2$ if the charging current $I_{CHARGE}$ is equal the discharging current $I_{DISCHARGE}$. However, if a cross point greater than $V_{CC}/2$ is desired, then the bias control voltages can be adjusted to provide a charging current $I_{CHARGE}$ greater than the discharging current $I_{DISCHARGE}$ to achieve this result. Similarly, the bias control voltages can be adjusted to provide a charging current $I_{CHARGE}$ less than the discharging current $I_{DISCHARGE}$ to provide a cross point less than $V_{CC}/2$.

Figure 4:
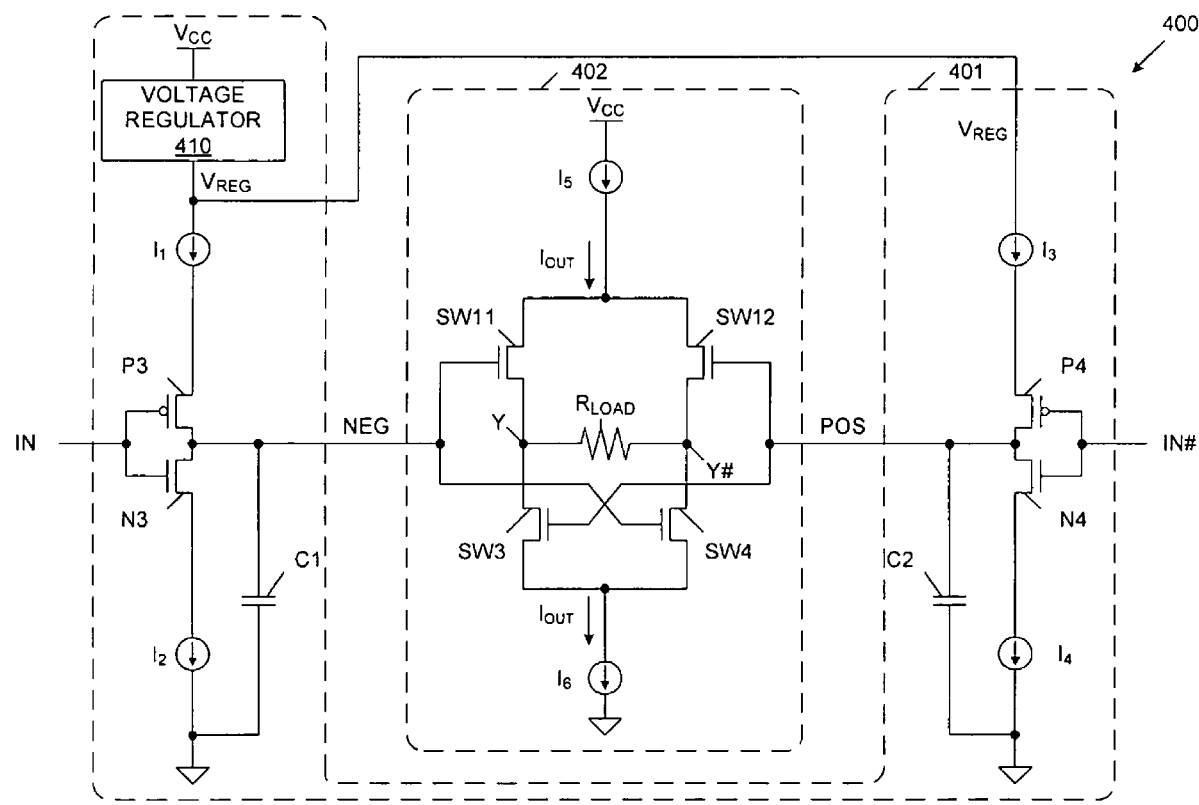
FIG. 4 is a circuit diagram of a multipoint LVDS (MLVDS) driver in accordance with one embodiment of the present invention.

FIG. 4 is a circuit diagram of a multipoint-LVDS (MLVDS) driver 400, in accordance with an alternate embodiment of the present invention. MLVDS driver 400 includes pre-driver circuit 401 and output driver circuit 402. Because MLVDS driver 400 is similar to LVDS driver 100 (FIG. 1), similar elements in FIGS. 1 and 4 are labeled with similar reference numbers. Note that the p-channel switching transistors SW1-SW2 of output driver circuit 102 (FIG. 1) are replaced with n-channel switching transistors SW11 and SW12 in output driver circuit 402 (FIG. 4). The voltage required to turn on n-channel switching transistors SW11 and SW12 is greater than the voltage required to turn on n-channel switching transistors SW3 and SW4. The gates of n-channel switches SW11 and SW4 are coupled to receive the output control voltage NEG from pre-driver circuit 401, and the gates of N-channel switches SW12 and SW3 are coupled to receive the output control voltage POS from pre-driver circuit 401.

In order to guarantee the four NMOS switches SW11, SW12, SW3 and SW4 turn on synchronously during transitions, the charging currents I1 and I3 are controlled to be larger than the discharging currents I2 and I4, thereby increasing the cross point of the output control voltages NEG and POS to a level greater than $V_{CC}/2$. A voltage regulator 410 is used to provide a steady regulated voltage $V_{REG}$ for use by the pre-driver circuit 401. The regulated voltage $V_{REG}$ remains constant, regardless of variations of the $V_{CC}$ supply voltage. The constant regulated voltage $V_{REG}$ causes the selected cross point of the output control voltages NEG and POS to remain fixed. This fixed cross point facilitates the synchronous turning on of the four NMOS switches SW11, SW12, SW3 and SW4 in certain processes. If the voltage regulator 410 were not included in the pre-driver circuit 401, variations in the $V_{CC}$ supply voltage would result in different cross points between output control voltages NEG and POS during transitions. These different cross points would undesirably affect the transitions of the NMOS switches SW11, SW12, SW3 and SW4, and change the slew rate of the output voltage provided across the load resistance $R_{LOAD}$.

Figure 5:
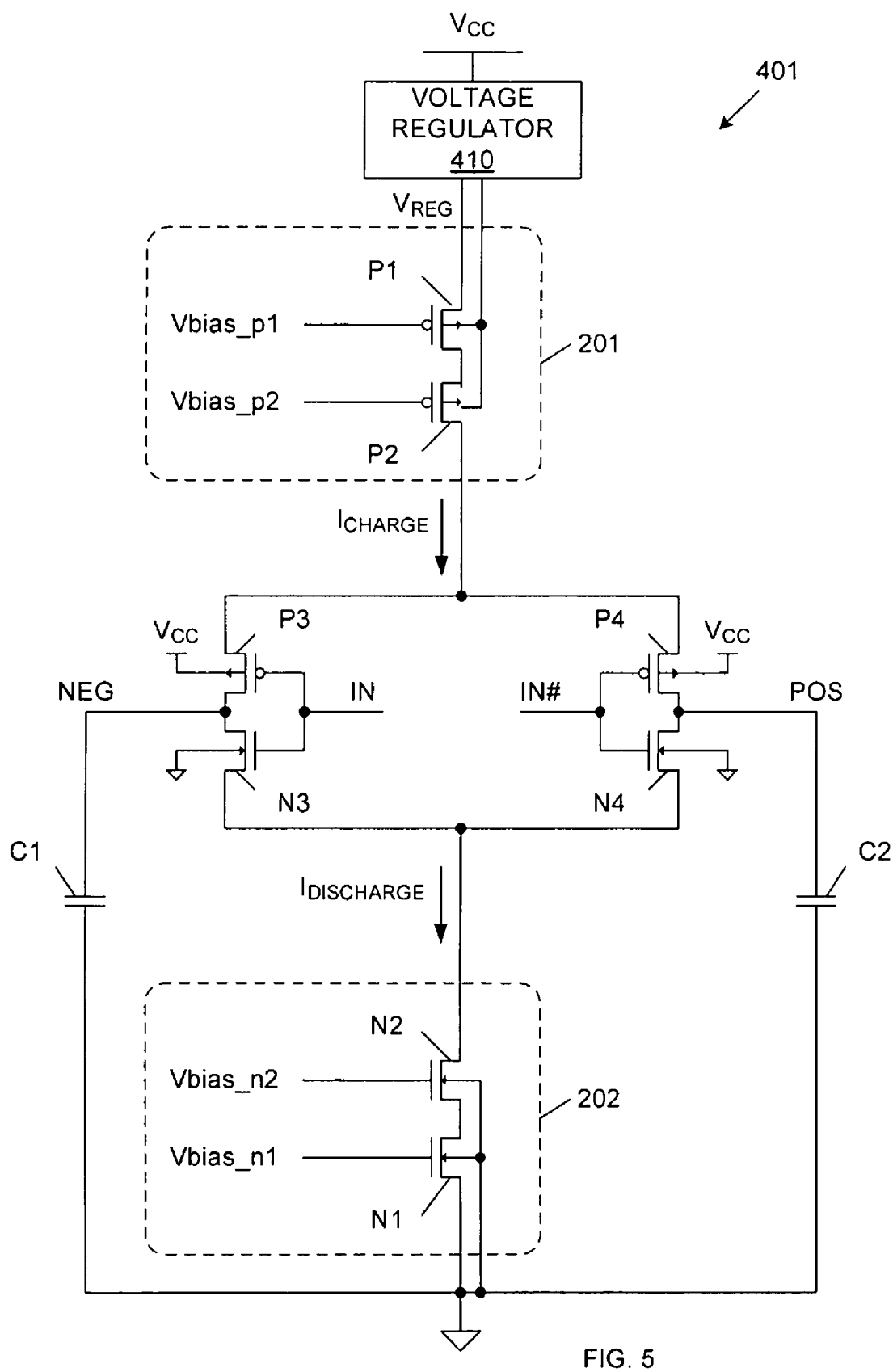
FIG. 5 is a circuit diagram of a pre-driver circuit used in the MLVDS driver of FIG. 4 in accordance with one embodiment of the present invention.

FIG. 5 is a circuit diagram of MLVDS pre-driver circuit 401 in accordance with one implementation of the present embodiment. Because MLVDS pre-driver circuit 401 is similar to LVDS pre-driver 101 (FIG. 2), similar elements in FIGS. 2 and 5 are labeled with similar reference numbers. The difference between LVDS pre-driver circuit 101 and MLVDS pre-driver circuit 401 is that MLVDS pre-driver circuit 401 operates in response to the regulated voltage $V_{REG}$ provided by voltage regulator 410, rather than directly in response to the $V_{CC}$ supply voltage. The advantages of this configuration are described above in connection with FIG. 4.

Figure 6:
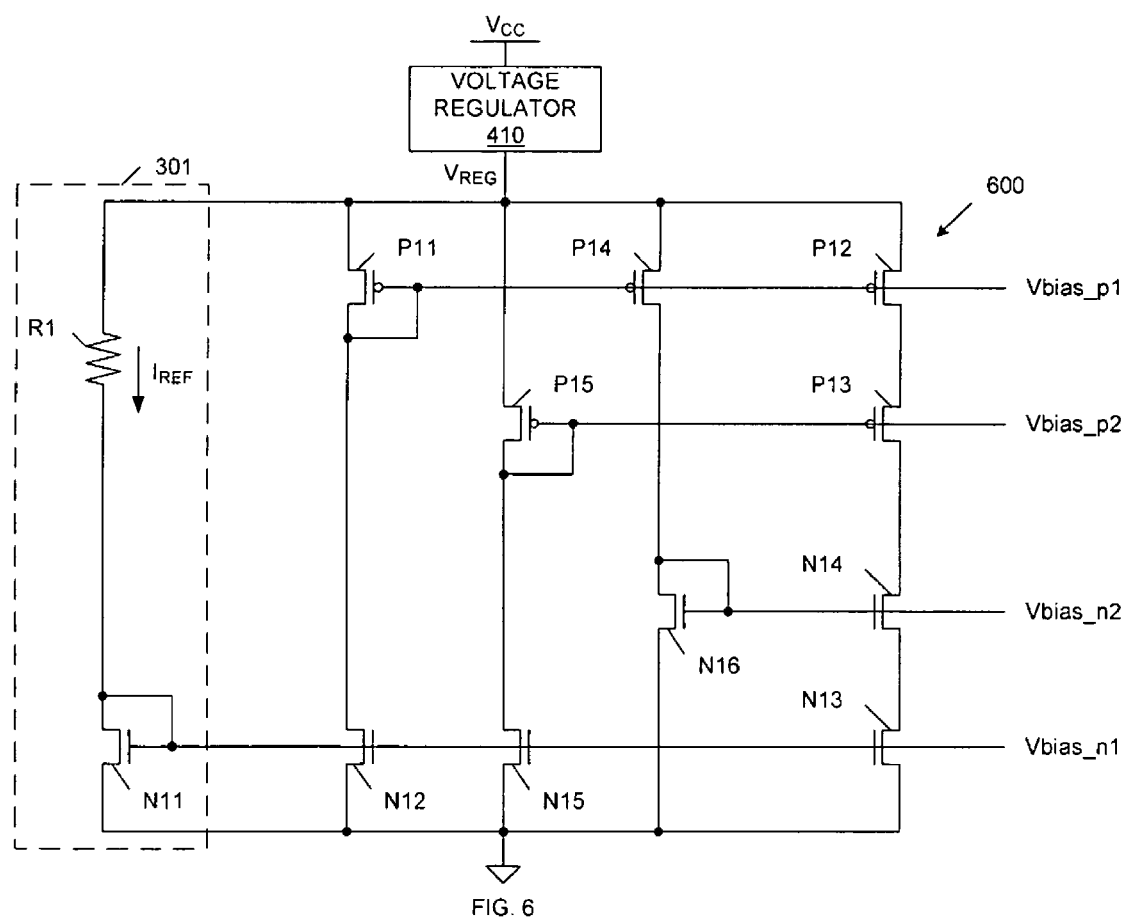
FIG. 6 is a circuit diagram of a bias circuit used to bias the pre-driver circuit of FIG. 5 in accordance with one embodiment of the present invention.

FIG. 6 is a circuit diagram of MLVDS pre-driver bias circuit 600 in accordance with one implementation of the present embodiment. Because MLVDS pre-driver bias circuit 600 is similar to LVDS pre-driver bias circuit 300 (FIG. 3), similar elements in FIGS. 3 and 6 are labeled with similar reference numbers. The difference between LVDS pre-driver bias circuit 300 and MLVDS pre-driver bias circuit 600 is that MLVDS pre-driver circuit 600 operates in response to the regulated voltage $V_{REG}$ provided by voltage regulator 410, rather than directly in response to the $V_{CC}$ supply voltage. The advantages of this configuration are described above in connection with FIG. 4.

Although the invention has been described in connection with several embodiments, it is understood that this invention is not limited to the embodiments disclosed, but is capable of various modifications, which would be apparent to one of ordinary skill in the art. Thus, the present invention is only intended to be limited by the following claims.

We claim:

1. A differential signal driver comprising:
   a pre-driver circuit configured to receive a first differential input signal and a second differential input signal, and in response, provide a first output control voltage and a second output control voltage; and
   an output driver circuit configured to provide a differential output signal in response to the first and second output control voltages,
   wherein the pre-driver circuit comprises:
      a current source configured to provide a charging current;
      a current sink configured to provide a discharging current;
      a first capacitor;
      a second capacitor;
      a first set of switching transistors configured to selectively couple the first capacitor to either the current source or the current sink in response to the first differential input signal, thereby developing the first output control voltage on the first capacitor;
      a second set of switching transistors configured to selectively couple the second capacitor to either the current source or the current sink in response to the second differential input signal, whereby the second output control voltage is developed on the second capacitor.

2. The differential signal driver of claim 1, wherein the output driver circuit comprises:
   an output current source configured to provide an output current;
   a load resistor; and
   a plurality of switches configured to steer the output current through the load resistor in response to the first and second output control voltages.

3. The differential signal driver of claim 2, wherein the plurality of switches comprise four transistors having the same conductivity type.

4. The differential signal driver of claim 3, wherein the pre-driver circuit further comprises a voltage regulator configured to provide a constant voltage to the current source.

5. The differential signal driver of claim 1, wherein the pre-driver circuit further comprises a bias control circuit configured to provide a first set of bias voltages to the current source, thereby causing the current source to provide the charging current, and a second set of bias voltages to the current sink, thereby causing the current sink to provide the discharging current.

6. The differential signal driver of claim 5, wherein the pre-driver circuit further comprises a voltage regulator configured to provide a constant voltage to the bias control circuit.

7. The differential signal driver of claim 1, wherein the charging current is equal to the discharging current.

8. The differential signal driver of claim 7, wherein the current source sources the charging current from a first supply voltage and the current sink sinks the discharging current to a second supply voltage, wherein a cross point of the first and second output control voltages occurs at a voltage equal to one half the sum of the first supply voltage and the second supply voltage.

9. The differential signal driver of claim 1, wherein the charging current is greater than the discharging current.

10. The differential signal driver of claim 9, wherein the current source sources the charging current from a first supply voltage and the current sink sinks the discharging current to a second supply voltage, wherein a cross point of the first and second output control voltages occurs at a voltage greater than one half the sum of the first supply voltage and the second supply voltage.

11. The differential signal driver of claim 1, wherein the current source comprises two p-channel transistors connected in a cascode configuration, and the current sink comprises two n-channel transistors connected in a cascode configuration.

12. The differential signal driver of claim 1, wherein the first set of switching transistors comprise:
   a first switching transistor configured to couple the current source to the first capacitor when the first differential input signal has a first logic state; and
   a second switching transistor configured to couple the current sink to the first capacitor when the first differential input signal has a second logic state; and
   wherein the second set of switching transistors comprise:
   a third switching transistor configured to couple the current source to the second capacitor when the second differential input signal has a first logic state, and;
   a fourth switching transistor configured to couple the current sink to the second capacitor when the second differential input signal has a second logic state.

13. The differential signal driver of claim 1, further comprising a voltage supply terminal coupled to the first capacitor and the second capacitor, whereby the voltage supply terminal applies a common supply voltage to the first capacitor and the second capacitor, and wherein the current sink provides the discharging current to the voltage supply terminal.

14. A differential signal driver comprising:
   a pre-driver circuit configured to receive a first differential input signal and a second differential input signal, and in response, provide a first output control voltage and a second output control voltage; and
   an output driver circuit configured to provide a differential output signal in response to the first and second output control voltages,
   wherein the pre-driver circuit comprises:
      a current source configured to provide a charging current;
      a current sink configured to provide a discharging current;
      a first capacitor;
      a second capacitor;
      a first set of switching transistors configured to selectively couple the first capacitor to either the current source or the current sink in response to the first differential input signal, thereby developing the first output control voltage on the first capacitor;
      a second set of switching transistors configured to selectively couple the second capacitor to either the current source or the current sink in response to the second differential input signal, whereby the second output control voltage is developed on the second capacitor; and
      a bias control circuit configured to provide a first set of bias voltages to the current source, thereby causing the current source to provide the charging current, and a second set of bias voltages to the current sink, thereby causing the current sink to provide the discharging current, wherein the bias control circuit includes a reference current generator configured to generate a reference current, current mirror circuitry configured to generate first and second sets of bias voltages in response to the reference current.

15. A method of operating a differential signal driver comprising:
 generating a constant charging current;
 generating a constant discharging current;
 charging a first capacitor with the constant charging current when a differential input signal has a first state, and discharging the first capacitor with the constant discharging current when the differential input signal has a second state, thereby developing a first output control voltage on the first capacitor;
 charging a second capacitor with the constant charging current when the differential input signal has the second state, and discharging the second capacitor with the constant discharging current when the differential input signal has the first state, thereby developing a second output control voltage on the second capacitor; and
 driving a differential output signal in response to the first and second output control voltages.

16. The method of claim 15, further comprising selecting the constant charging current and the constant discharging to specify a slew rate of the first and second output control voltages.

17. The method of claim 15, further comprising selecting the constant charging current and the constant discharging to specify a slew rate of the differential output signal.

18. The method of claim 15, further comprising selecting the constant charging current and the constant discharging current to specify a cross point of the first output control voltage and the second output control voltage.

* * * * *